United States Patent
Das

(10) Patent No.: US 7,508,260 B2
(45) Date of Patent: Mar. 24, 2009

(54) BYPASSABLE LOW NOISE AMPLIFIER TOPOLOGY WITH MULTI-TAP TRANSFORMER

(75) Inventor: Amitava Das, Palatine, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 11/941,473

(22) Filed: Nov. 16, 2007

(65) Prior Publication Data
US 2008/0081590 A1 Apr. 3, 2008

Related U.S. Application Data

(63) Continuation-in-part of application No. 11/210,315, filed on Aug. 24, 2005, now abandoned.

(51) Int. Cl.
*H03F 1/14* (2006.01)
*H03F 3/26* (2006.01)

(52) U.S. Cl. .................. 330/51; 330/276
(58) Field of Classification Search .......... 330/51, 330/86, 110, 124 D, 151, 195, 276, 278, 302
See application file for complete search history.

(56) References Cited

U.S. PATENT DOCUMENTS

| | | | |
|---|---|---|---|
| 3,531,732 A * | 9/1970 | Thompson | 330/282 |
| 4,042,887 A * | 8/1977 | Mead et al. | 330/53 |
| 6,586,993 B2 | 7/2003 | Macedo | |
| 6,754,510 B2 | 6/2004 | Hey-Shipton | |
| 6,768,377 B2 | 7/2004 | Macedo | |
| 6,838,933 B2 | 1/2005 | Goyette et al. | |
| 2002/0053947 A1 | 5/2002 | Macedo | |
| 2003/0081694 A1 | 5/2003 | Wieck | |

(Continued)

FOREIGN PATENT DOCUMENTS

EP    0862280 B1    12/2003

(Continued)

OTHER PUBLICATIONS

Watanabe, G.; Lau, H.; Schultz, T.; Dozier, C.; Denig, C.; Fu, H.; "High Performance RF front-end circuits for CDMA receivers utilizing BiCMOS and copper technologies," Radio and Wireless Conference, 2000. RAWCON 2000. 2000 IEEE, Sep. 10-13, 2000, pp. 211-214.

*Primary Examiner*—Khanh V Nguyen
(74) *Attorney, Agent, or Firm*—Brinks Hofer Gilson & Lione

(57) ABSTRACT

An amplifier is disclosed that contains a transistor (BJT), a switch (MOSFET), and a transformer. The collector of the BJT is connected to an end of the transformer while the base of the BJT is connected to a point between the ends of the transformer through the MOSFET. When the amplifier is in an active mode in which the amplifier has gain, signals supplied to the amplifier are provided to the transformer through the BJT. When the amplifier is in a bypass mode in which the amplifier does not have gain, signals supplied to the amplifier are provided to the transformer through the MOSFET and the BJT is turned off. The amplifier is designed such that the amplifier characteristics are optimized and then the MOSFET is connected to the transformer such that the input impedance of the amplifier is independent of the mode.

18 Claims, 5 Drawing Sheets

U.S. PATENT DOCUMENTS

| | | |
|---|---|---|
| 2003/0231055 A1 | 12/2003 | Macedo |
| 2004/0008094 A1 | 1/2004 | Niemi |
| 2004/0066230 A1 | 4/2004 | Goyette et al. |
| 2004/0092243 A1 | 5/2004 | Hey-Shipton |
| 2004/0251960 A1 | 12/2004 | Macedo |
| 2005/0150736 A1 | 7/2005 | Kataoka et al. |

FOREIGN PATENT DOCUMENTS

| | | | |
|---|---|---|---|
| EP | 1381162 | A2 | 1/2004 |
| EP | 1406382 | A2 | 4/2004 |
| JP | 2004274713 | A | 11/2002 |
| JP | 2004007244 | A | 1/2004 |
| JP | 2002335187 | A | 9/2004 |
| WO | WO 02052722 | A1 | 7/2002 |
| WO | WO 03052949 | A1 | 6/2003 |

\* cited by examiner ated, and a bypass stage 220. The amplifier 200 has two modes: an
BYPASSABLE LOW NOISE AMPLIFIER TOPOLOGY WITH MULTI-TAP TRANSFORMER

PRIORITY CLAIM

This application is a continuation-in-part of co-pending U.S. application Ser. No. 11/210,315, filed Aug. 24, 2005, which is incorporated by reference.

TECHNICAL FIELD

The present application relates to a low noise amplifier. More specifically, the present application relates to a bypassable low noise amplifier containing a transformer with one or more taps.

BACKGROUND

The variety and use of electronic devices, especially portable electronic devices such as cellular telephones, laptop computers, and personal digital assistants (PDAs), has dramatically increased in recent years. Many electronic devices, in addition, communicate with other electronic devices. For example, cellular telephones use base stations to route and amplify data transmission. When designing communication devices used in portable electronic devices, various considerations are taken into account when designing the transmitter and receiver used for transmitting and receiving signals containing the data.

One such consideration is power consumption, which affects battery lifetime. In the receiver of a portable electronic device, the received signals are provided to multiple modules, each of which consumes power when operational. One of these modules is a low noise amplifier. The amplifier is used to amplify the signals for further processing if the portable electronic device is far from the transmission origin (e.g. base station) to boost the signal strength to adequate levels to be used by downstream modules. If the portable electronic device is sufficiently close to the transmitter origin, the received signals may be strong enough such that gain provided by the amplifier may be reduced or eliminated. Regardless of the amount of gain, the input impedance of the amplifier, i.e. the amount of impedance experienced by the signals provided to the input, should be the same to enable the same matching network to be used in both the situations.

DETAILED DESCRIPTION OF THE EMBODIMENTS

A low noise amplifier (LNA) is disclosed that contains an active stage, a bypass switch, and a transformer. In an active mode, when the amplifier provides gain to high frequency input signals supplied to the amplifier, the signals are supplied to the transformer through the active stage. In a bypass mode, when the amplifier does not provide gain to the input signals, the signals are supplied to the transformer through the bypass switch and the active stage is turned off. By judicious selection of the point of connection to the transformer by the bypass switch, the impedance in both the active mode and bypass mode can be equalized. In addition, as the active stage is turned off, the power consumed by the amplifier is reduced substantially.

Figure 1:
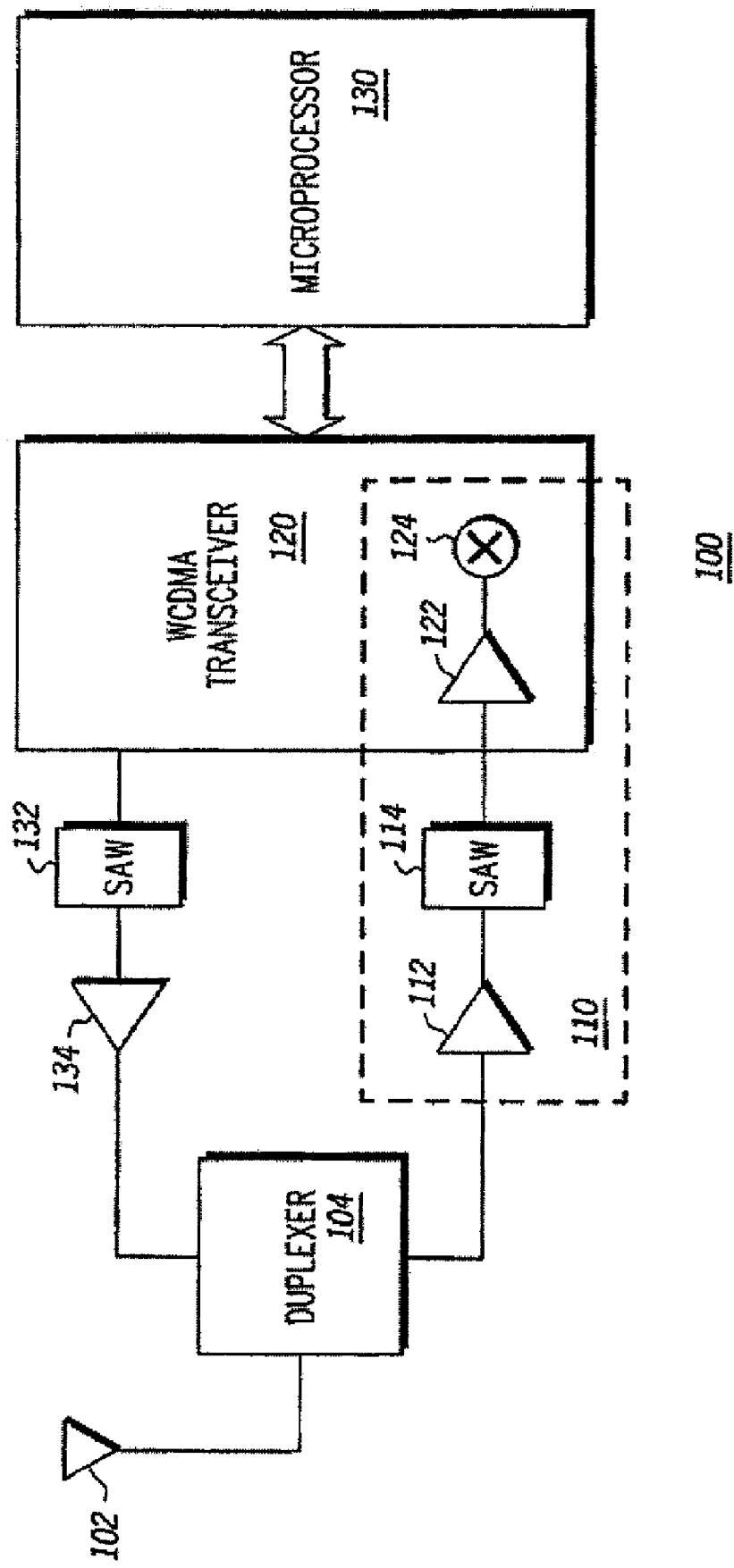
FIG. 1 shows circuits in an electronic device in accordance with an embodiment.

FIG. 1 illustrates an embodiment of an electronic device 100 according to one embodiment of the present invention. The electronic device 100 may be a portable electronic device such as a cellular telephone, laptop computer, or personal digital assistant (PDAs). Other components are present within the electronic device 100 and well known to one of skill in the art, but are not shown in FIG. 1 for clarity. The electronic device 100 may be used in, for example, 3G W-CDMA communications (third generation wideband code division multiple access). W-CDMA can support mobile/portable voice, images, data, and video communications at high speeds of up to 2 Mbps (megabits per second). The input signals are digitized and transmitted in coded, spread-spectrum mode over a broad range of frequencies. A 5 MHz-wide carrier is used, compared with 200 KHz-wide carrier for GSM.

As shown, the electronic device 100 contains an antenna 102 which receives input signals and transmits output signals. The input signals received by the antenna 102 are radio frequency (RF) signals that have a frequency in one of several ranges: 2110-2170, 1930-1990, or 869-894 MHz, for example.

The antenna 102 is connected to a duplexer 104 which provides isolation between input signals that are to be received or output signals that are to be transmitted by the electronic device 100. The input signals are distributed along a reception path 110. The reception path 110, for example, may contain an external low noise amplifier 112 connected to the duplexer 104 and a receiver SAW filter 114 connected to the low noise amplifier 112.

An internal low noise amplifier 122 of the reception path 110 is integrated within a transceiver 120 and is connected with the receiver SAW filter 114. The internal low noise amplifier 122 is connected with a mixer 124 integrated in the transceiver 120. The mixer 124 downconverts the RF signals to baseband signals of up to about a few MHz for further processing in the transceiver 120. The transceiver 120 communicates with a microprocessor 130. The transceiver 120 also supplies signals to the antenna 102 through a transmitter SAW filter 132, a power amplifier 134, and the duplexer 104.

Figure 2:
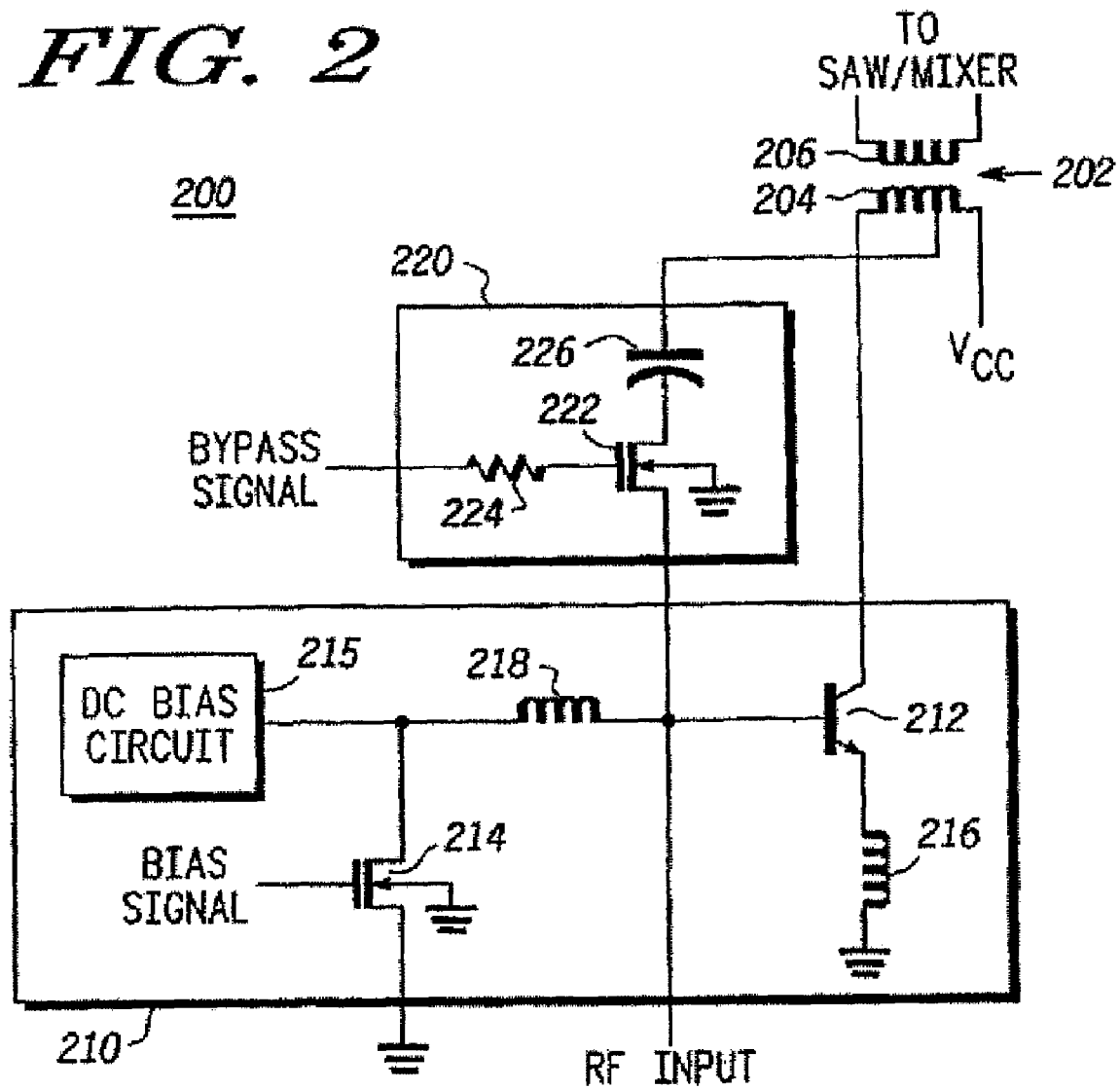
FIG. 2 illustrates a first embodiment of an amplifier.

FIG. 2 illustrates an embodiment of a low noise amplifier. The amplifier 200 may be either the external amplifier 112 or the internal amplifier 122. As shown in FIG. 2, the low noise amplifier 200 contains a transformer 202, an active stage 210 and a bypass stage 220. The amplifier 200 has two modes: an active mode, in which the amplifier 200 provides gain to RF input signals supplied to it, and a bypass mode, in which the amplifier 200 does not provide gain to the RF input signals.

The transformer 202 has an input coil 204 and an output coil 206. The output coil 206 is connected to the SAW filter 114 or the mixer 124. One end of the input coil 204 is connected to a power supply (not shown) and the other end is connected to the active stage 210.

The active stage 210 contains a bipolar junction transistor (BJT) 212, a DC bias circuit 215, a bias switch 214, and first and second inductors 216 and 218. As one example, the inductance of the inductor 216 is less than 2 nH, which gives an impedance of a few $\Omega$ in the frequency range of the input signals. The inductance of the transformer 202 is high (about 25-30 nH), which provides an impedance of hundreds of $\Omega$.

The overall impedance seen by the RF input signals entering the amplifier 200 is typically about 50Ω but could assume other values depending on the design and application.

The collector of the BJT 212 is connected to the other end of the input coil 204. The emitter of the BJT 212 is connected to ground through the first inductor 216. The RF input signals are supplied to the base of the BJT 212. The bias circuit 215 provides DC biasing to the base of the BJT 212 through the second inductor 218 (or a high value resistor) such that the BJT 212 is ON in the active mode and is OFF in the bypass mode. The second inductor 218 provides a large impedance to the input signals supplied to the base of the BJT 212 so that the input signals are supplied to the transformer 202 without substantial signal loss.

The bias switch 214, in the embodiment shown, is formed by a metal-oxide-semiconductor field effect transistor (MOSFET). The source of the MOSFET bias switch 214 is connected to ground, the drain is connected to the second inductor 218, and the gate is supplied with a bias on/off switch. The MOSFET bias switch 214 is turned on in the bypass mode such that one end of the second inductor 218 is grounded. The DC bias circuit 215 may be turned off in the bypass mode. Similarly, the MOSFET bias switch 214 is turned off in the active mode such that one end of the second inductor 218 is DC biased at the bias voltage provided by the DC bias circuit 215.

The bypass stage 220 contains bypass switch 222 formed by a MOSFET 222, a resistor 224, and a capacitor 226. The gate of the bypass switch 222 is supplied with a bypass signal through the resistor 224. The source of the bypass switch 222 is connected to the base of the BJT 212 and the second inductor 218. The drain of the bypass switch 222 is connected to the input coil 204 of the transformer 202 through the capacitor 226, which blocks a DC voltage from being grounded in the bypass mode. More specifically, the drain of the bypass switch 222 taps the transformer 202 at a different turn than the turn that is connected to the collector of the BJT 212. One end of the transformer 204 is connected to the power supply.

When the amplifier 200 is in the active mode, the bypass switch 222 is turned off and the input signals are provided to the transformer 202 through the BJT 212. The BJT 212 provides gain for the input signals so that the output signals supplied to the mixer 106 are amplified. When the amplifier 200 is in the bypass mode, the BJT 212 is turned off and the input signals are provided to the transformer 202 through the bypass switch 222. In the embodiment shown in FIG. 2, the MOSFET acts merely as a switch to provide the input signals to the transformer 202 in the bypass mode and does not provide the input signals with gain.

Note that, as neither the BJT 212 nor the MOSFET 222 draws a significant amount of current in the bypass mode (on the order of a few nA) compared with the active mode (in which the BJT 212 draws a few mA), the amount of power consumed by the amplifier 200 in the bypass mode is small. In alternate embodiments, a MOSFET may be used in the gain stage rather than a BJT.

Figure 3:
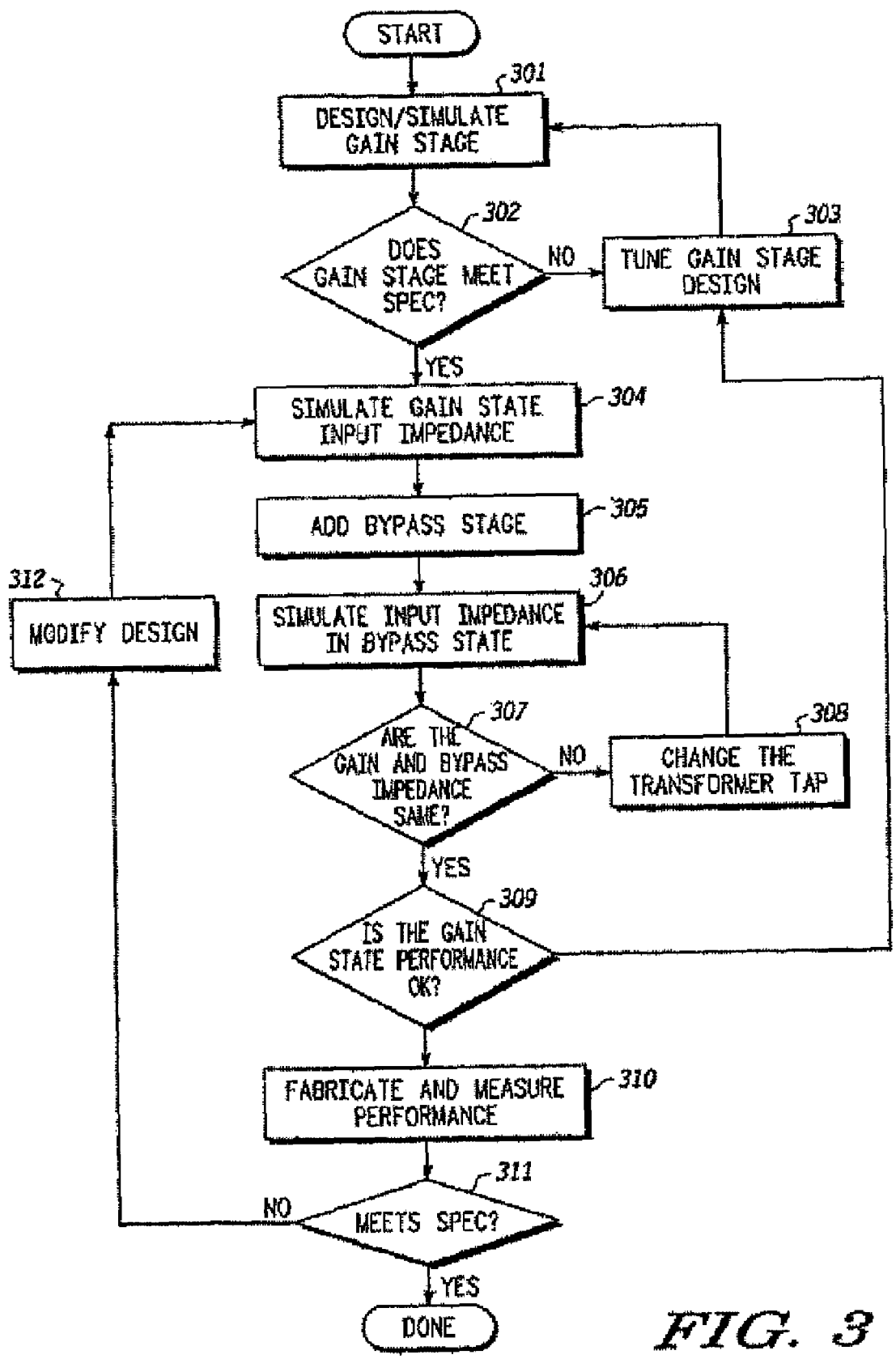
FIG. 3 shows one embodiment of a method of providing an amplifier in accordance with an embodiment.

One method of producing the amplifier is shown in FIG. 3. The amplifier is designed with desired gain stage characteristics, such as linearity, current drain, noise figure and input impedance in block 301. The design process is iterated until gain stage specs are met, as shown, the gain stage is tested in block 302 and if the optimization of the gain stage is not compliant, the value is tuned in block 303 and resimulated. Gain stage optimization uses optimized sizing of gain stage transistors, such as 212 in FIG. 2, based on an assumed input source impedance which is typically (but not necessarily) chosen to be 50 Ohm. Once the gain stage design is tuned, gain state input impedance is simulated in block 304. A bypass stage is added in block 305. Next, the input impedance of the bypass stage is simulated in block 306 and the input impedance in the gain and bypass states compared in block 307. The bypass stage input impedance is tuned in block 308 through changing the position of the transformer tap until the bypass mode input impedance is close to the gain mode impedance and a single matching circuit is able to provide acceptable (better than 12 dB) return loss in both the bypass and operation states (or modes) in block 306. The addition of a bypass mode also impacts the gain mode performance, albeit to a lesser degree. Thus, once the bypass mode transformer tap is selected, the gain mode performance is rechecked in block 309 to ensure that no significant shift has taken place in gain mode performance. If the gain mode performance has shifted by more than about 2-3%, the process is iterated via block 303.

In block 309, the device is fabricated and the actual performance is measured. It is determined whether the actual performance meets specifications in block 311. If the actual performance meets specifications, the process is completed. If the actual performance does not meet specifications, the design is modified in block 312 and the process is repeated from simulation of the gain stage input impedance in block 304 until an amplifier that is compliant with the specifications is fabricated. In a typical design/fabricate process shown in FIG. 3, a few amplifiers are designed and fabricated before a sufficient design is achieved. Intelligent use of transformer taps may reduce the number of iterations at the cost of additional parasitic capacitances.

Figure 4:
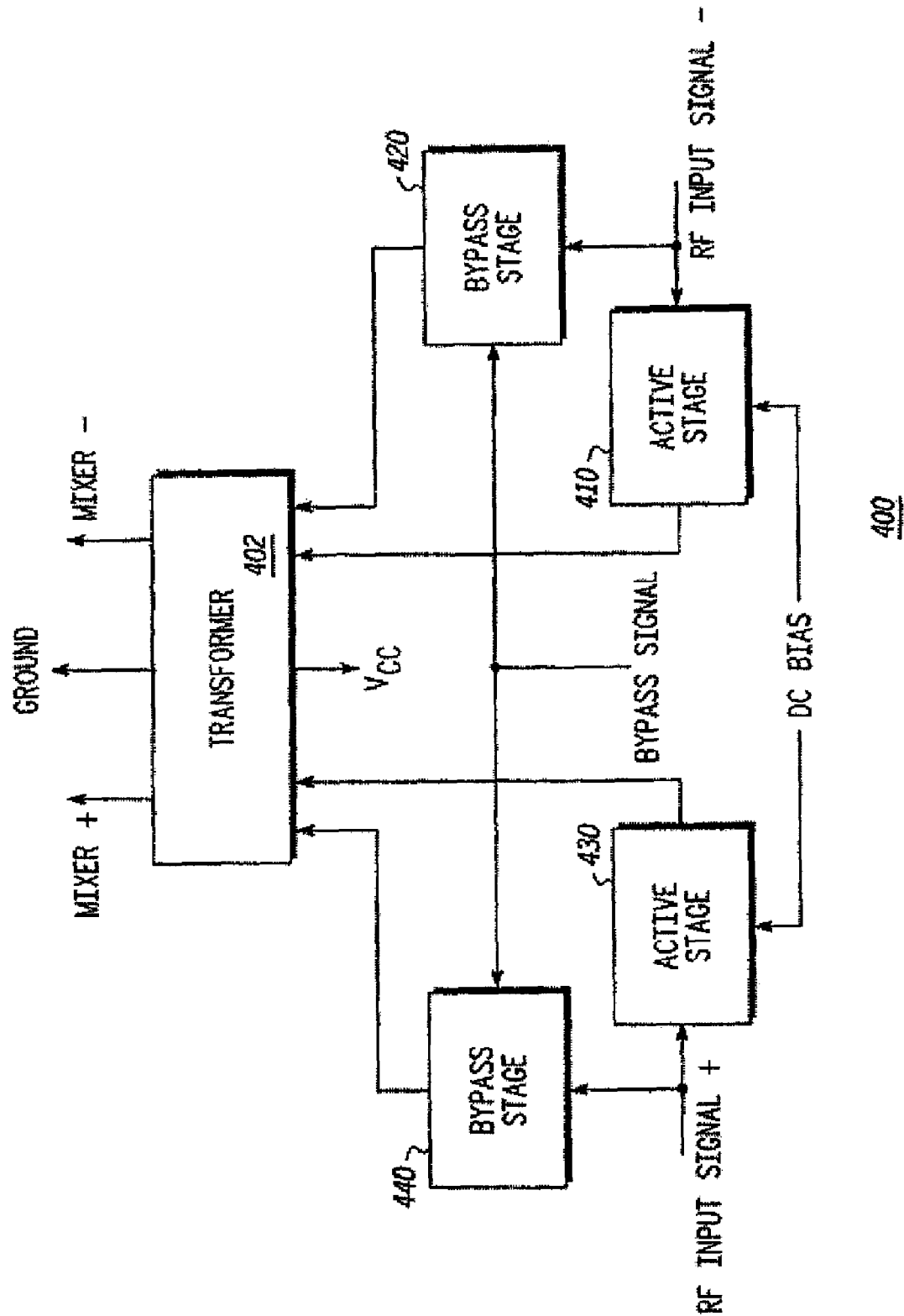
FIG. 4 illustrates a second embodiment of an amplifier.

FIG. 4 illustrates one embodiment of a differential amplifier 400. The differential amplifier 400 contains a transformer 402, a pair of active stages 410 and 430, and a pair of bypass stages 420 and 440 connected in a differential mode connection. Each of the first active stage 410 and the first bypass stage 420 is connected to different locations on one side of the transformer 402. The first and second active stages 410 and 430 are connected at ends of the transformer 402, symmetrically around the center of the transformer 402. Similarly, the first and second bypass stages 420 and 440 are connected symmetrically around the center of the transformer 402. The center of the input coil of transformer 402 is connected to power (Vcc), the center of the output coil of the transformer 402 is connected to ground, and the ends of the output coil are connected to SAW filters or to the inputs of a differential mixer (not shown).

The active stages 410 and 430 and bypass stages 420 and 440 are similar to the active stage 210 and bypass stage 220, respectively, and are fed by the same bypass and bias signals described in FIG. 2. As in the previous embodiment, the active stages 410 and 430 and bypass stages 420 and 440 are connected such that the impedance seen by the input signals is the same regardless of whether the amplifier 400 is in the active mode or the bypass mode.

The amplifier shown can be either provided in half-duplex electronic devices, as shown in FIG. 1 or in full duplex electronic devices. Full duplex electronic devices can transmit and receive at the same time while half-duplex duplex electronic devices can either transmit or receive, but do not both transmit and receive at the same time.

Figure 5:
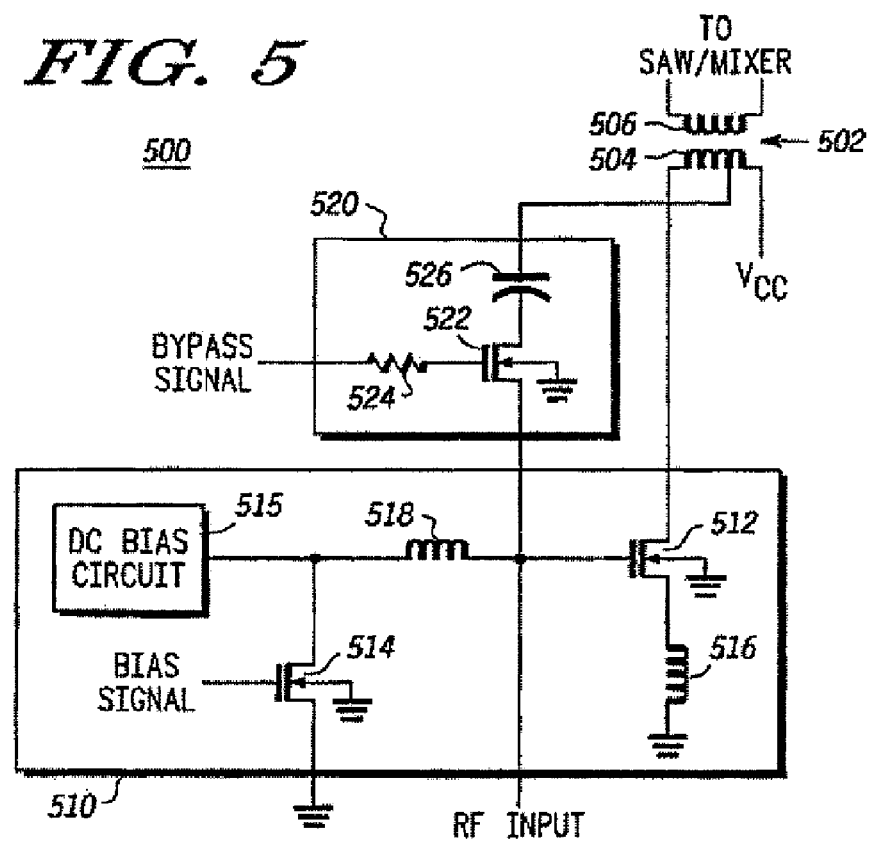
FIG. 5 illustrates a third embodiment of an amplifier.

FIG. 5 illustrates another embodiment of a low noise amplifier of the present invention. As shown in FIG. 5, the low noise amplifier 500 contains a transformer 502, an active stage 510 and a bypass stage 520. The amplifier 500 has two modes: an active mode, in which the amplifier 500 provides gain to RF input signals supplied to it, and a bypass mode, in which the amplifier 500 does not provide gain to the RF input signals.

The transformer 502 has an input coil 504 and an output coil 506. The output coil 506 is connected to the SAW filter 114 or the mixer 124. One end of the input coil 504 is connected to a power supply (not shown) and the other end is connected to the active stage 510.

The active stage 510 contains a gain transistor 512, a DC bias circuit 515, a bias switch 514, and first and second inductors 516 and 518. Unlike the embodiment of FIG. 2, the gain transistor 512 in this embodiment is a MOSFET, rather than a BJT. The drain of the MOSFET 512 is connected to the other end of the input coil 504. The source of the MOSFET 512 is connected to ground through the first inductor 516. The RF input signals are supplied to the gate of the MOSFET 512. The bias circuit 514 provides DC biasing to the base of the MOSFET 512 through the second inductor 518 such that the MOSFET 512 is on in the active mode and is off in the bypass mode. The second inductor 518 provides a large impedance to the input signals supplied to the base of the MOSFET 512 so that the input signals are supplied to the transformer 502 without substantial signal loss.

The source of a MOSFET bias switch 514 is connected to ground, the drain is connected to the second inductor 518, and the gate is supplied with a bias on/off switch. The MOSFET bias switch 514 is turned on in the bypass mode such that one end of the second inductor 518 is grounded. The DC bias circuit 515 may be turned off in the bypass mode. Similarly, the MOSFET bias switch 514 is turned off in the active mode such that one end of the second inductor 518 is DC biased at the bias voltage provided by the DC bias circuit 515.

The bypass stage 520 contains MOSFET bypass switch 522, a resistor 524, and a capacitor 526. The gate of the bypass switch 522 is supplied with a bypass signal through the resistor 524. The resistor 524 decreases the current supplied to the gate of the bypass switch 522 when the amplifier 500 enters the bypass mode. The source of the bypass switch 522 is connected to the gate of the MOSFET 512 and the second inductor 518. The drain of the bypass switch 522 is connected to the input coil 504 of the transformer 502 through the capacitor 526, which blocks a DC voltage from being supplied to the transformer 502. More specifically, the drain of the bypass switch 522 taps the transformer 502 and is connected between the end of the input coil 504 connected to the MOSFET 512 and the end of the input coil 504 connected to the power supply.

When the amplifier 500 is in the active mode, the bypass switch 522 is turned off and the input signals are provided to the transformer 502 through the MOSFET 512. The MOSFET 512 provides gain for the input signals so that the output signals supplied to the mixer 106 are amplified. When the amplifier 500 is in the bypass mode, the MOSFET 512 is turned off and the input signals are provided to the transformer 502 through the bypass switch 522. The MOSFET bypass switch acts merely as a switch to provide the input signals to the transformer 502 in the bypass mode and does not provide the input signals with gain.

Figure 6:
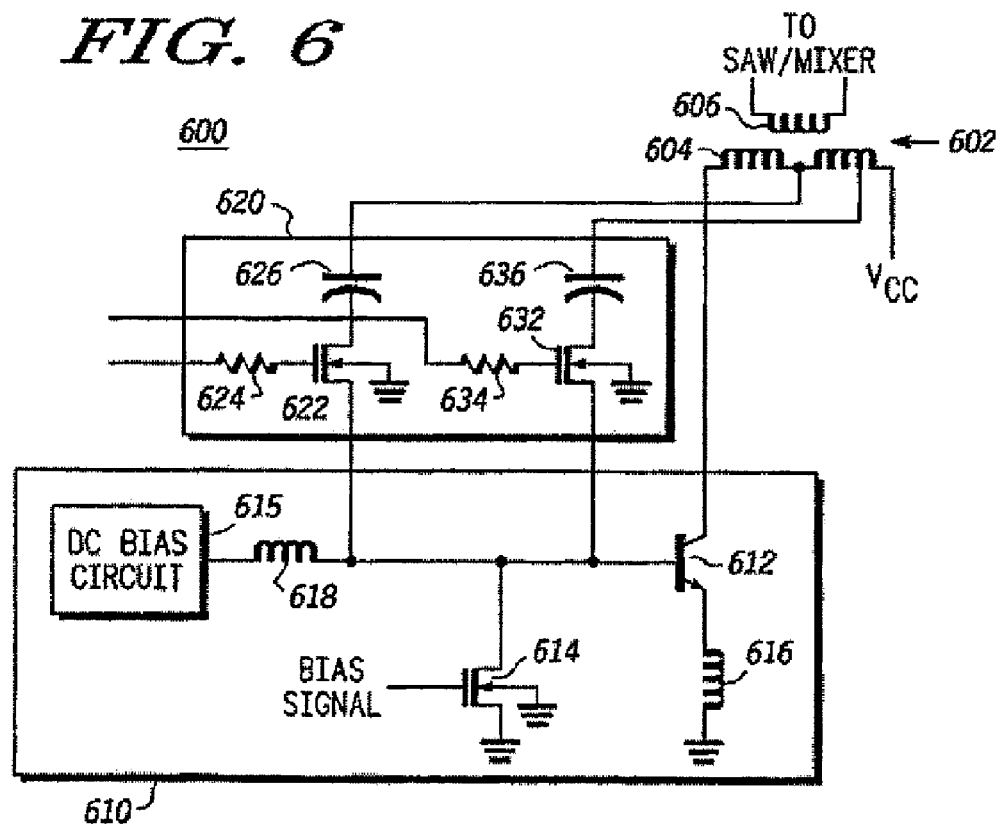
FIG. 6 illustrates a fourth embodiment of an amplifier.

FIGS. 2 and 5 show embodiments in which the bypass switch taps only at one point of the transformer. However, the transformer may have multiple taps. One such embodiment of an amplifier 600 is shown in FIG. 6. As shown, the low noise amplifier 600 contains a transformer 602, an active stage 610 and a bypass stage 620.

The transformer 602 has an input coil 604 and an output coil 606. The output coil 606 is connected to the SAW filter 114 or the mixer 124. One end of the input coil 604 is connected to a power supply (not shown) and the other end is connected to the active stage 610.

The active stage 610 contains a bipolar junction transistor (BJT) 612, a DC bias circuit 615, a bias switch 614, and first and second inductors 616 and 618. The collector of the BJT 612 is connected to the other end of the input coil 604. The emitter of the BJT 612 is connected to ground through the first inductor 616. The RF input signals are supplied to the base of the BJT 612. The bias circuit 615 provides DC biasing to the base of the BJT 612 through the second inductor 618 (or a high value resistor) such that the BJT 612 is ON in the active mode and is OFF in the bypass mode. The second inductor 618 provides a large impedance to the input signals supplied to the base of the BJT 612 so that the input signals are supplied to the transformer 602 without substantial signal loss.

The bias switch 614 is formed by a metal-oxide-semiconductor field effect transistor (MOSFET). The source of the MOSFET bias switch 614 is connected to ground, the drain is connected to the second inductor 618, and the gate is supplied with a bias on/off switch. The MOSFET bias switch 614 is turned on in the bypass mode such that one end of the second inductor 618 is grounded. The DC bias circuit 615 may be turned off in the bypass mode. Similarly, the MOSFET bias switch 614 is turned off in the active mode such that one end of the second inductor 618 is DC biased at the bias voltage provided by the DC bias circuit 615

The bypass stage 620 contains bypass switches 622 and 632 formed by MOSFETs, resistors 624 and 634, and capacitors 626 and 636. The gates of the bypass switches 624 and 634 are supplied with bypass signals through the resistors 624 and 634. The sources of the bypass switches 624 and 634 are connected to the base of the BJT 612 and the second inductor 618. The drains of the bypass switches 624 and 634 are connected to the input coil 604 of the transformer 602 through the capacitors 626 and 636. More specifically, the drain of the bypass switch 622 taps the transformer 602 at a different turn than the turn that is connected to the drain of the bypass switch 632. One end of the transformer 604 is connected to the power supply.

The additional transformer taps permit flexibility in the design to switch between taps once the amplifier is fabricated. As mentioned above, simulation results typically do not match the measured data perfectly, hence design revisions are performed. The additional transformer taps provide an option through which the bypass mode impedance may be adjusted if the impedance or other characteristics deviate from the expected results in an unacceptable manner. In addition, the input impedance may be programmable in the bypass mode with multiple taps. In embodiments in which the gain mode is programmable to provide various gains, the input impedance of the gain mode may be adjusted depending on how the gain control is implemented. In such embodiments, transformer taps in the bypass mode provide an option to change the bypass mode impedance in conjunction with the gain mode change. However, multiple transformer taps add additional parasitic capacitance to the amplifier, which may degrades the LNA performance.

In the above embodiments, an amplifier is disclosed that contains an active stage, one or more bypass switches, and a transformer. The amplifier may be a single input or differential amplifier. The bypass switch is connected to the transformer at a tap. If multiple bypass switches are present, the bypass switches may be connected to different taps. The taps are positioned such that the impedance of the amplifier in both the active mode and bypass mode can be made equal under a variety of conditions.

In the foregoing specification, the invention has been described with reference to specific embodiments. However, one of ordinary skill in the art appreciates that various modifications and changes can be made without departing from the scope of the present invention as set forth in the claims below. For example, although BJT's or MOSFETs have been used, MISFETs (metal-insulator-semiconductor transistors) or other transistors may be used. Either NMOS or PMOS devices may be used as desired, although NMOS devices are faster. In addition, the locations of various connections to the transformer by the transistor(s) and switch(es) may be altered from the figures and descriptions above. Also, the amplifier may have a single predetermined amplification factor when in the active mode or may have a variable amplification. Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

I claim:

1. An amplifier comprising:
   a first transistor;
   a first switch; and
   a transformer having an input coil to which the first transistor and first switch are coupled at different points, the amplifier having a first mode in which current is drawn by the amplifier and a second mode in which less current is drawn by the amplifier than in the first mode;
   wherein an input impedance of the amplifier remains substantially constant independent of a gain supplied by the amplifier.

2. The amplifier of claim 1, further comprising a second switch, wherein the second switch is connected to the input coil at a different location than the first switch or the first transistor.

3. The amplifier of claim 1, further comprising a bias circuit that DC biases the first transistor to turn on the first transistor in the first mode, the first transistor turned off in the second mode.

4. The amplifier of claim 1, wherein one end of the first switch is connected to an input terminal of the first transistor.

5. The amplifier of claim 1, wherein the first transistor comprises a bipolar junction first transistor (BJT) and the first switch comprises a metal-oxide-semiconductor (MOS) device.

6. The amplifier of claim 1, further comprising a second transistor and a second switch coupled to the input coil at different points and symmetric about a center of the input coil with the first transistor and first switch.

7. An amplifier comprising:
   a transformer including an input coil with multiple taps configured to receive an input signal, the amplifier having a first operating mode in which the input signal is amplified and supplied to a first of the taps and a second operating mode in which the input signal is supplied to a second of the taps;
   wherein an input impedance of the amplifier remains substantially constant independent of a gain supplied by the amplifier.

8. The amplifier of claim 7, wherein the input signal supplied to the second tap is not amplified in the second operating mode.

9. The amplifier of claim 7, wherein the amplifier is a low noise amplifier.

10. A transceiver comprising the amplifier of claim 9.

11. A receiver comprising the amplifier of claim 9.

12. A method of operating an amplifier comprising a transformer with multiple taps, the method comprising:
    selecting at least one of the taps of the transformer to determine a mode of the amplifier, wherein a first tap is selected in a first operating mode and a second tap is selected in a second operating mode; and
    providing an input signal to the transformer after the mode has been selected;
    wherein an input impedance of the amplifier is substantially independent of the mode of the amplifier.

13. The method of claim 12, wherein the input signal supplied to the second tap is not amplified in the second operating mode.

14. The method of claim 12, further comprising amplifying the input signal using a first transistor when the amplifier is in the first operating mode.

15. The method of claim 14, further comprising amplifying the input signal using a second transistor when the amplifier is in the first operating mode such that the first and second transistors form a differential mode connection.

16. The method of claim 12, further comprising operating the amplifier in a transceiver.

17. The method of claim 12, further comprising operating the amplifier in a receiver.

18. The method of claim 12, wherein current drawn by the amplifier in the second operating mode is less than that drawn by the amplifier in the first operating mode.

* * * * *